(12) United States Patent
Cical et al.

(10) Patent No.: US 9,377,795 B1
(45) Date of Patent: Jun. 28, 2016

(54) TEMPERATURE CORRECTION OF AN ON-CHIP VOLTAGE REFERENCE

(71) Applicant: Xilinx, Inc., San Jose, CA (US)

(72) Inventors: Ionut C. Cical, Dublin (IE); Edward Cullen, Clane (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/543,526

(22) Filed: Nov. 17, 2014

(51) Int. Cl.
*G05F 1/46* (2006.01)
*H03F 1/30* (2006.01)

(52) U.S. Cl.
CPC ............... *G05F 1/463* (2013.01); *G05F 1/468* (2013.01); *H03F 1/30* (2013.01)

(58) Field of Classification Search
CPC ........... G05F 1/463; H03F 1/30; H03F 1/301; H03F 1/303–1/304
See application file for complete search history.

(56) References Cited

U.S. PATENT DOCUMENTS

| | | | | |
|---|---|---|---|---|
| 5,936,391 A * | 8/1999 | Larsen | ...................... | G05F 3/222 323/313 |
| 6,377,110 B1 * | 4/2002 | Cooper | .................. | G01K 15/00 257/470 |
| 7,857,510 B2 * | 12/2010 | Liepold | .................. | G01K 3/005 327/512 |
| 7,928,973 B2 * | 4/2011 | Oku | ........................ | G09G 3/367 345/211 |
| 8,094,839 B2 * | 1/2012 | Lee | .......................... | G01H 11/06 381/104 |
| 8,240,204 B2 * | 8/2012 | Kanai | ..................... | G01C 19/56 73/497 |
| 8,493,114 B2 * | 7/2013 | Cho | ......................... | H03L 1/022 327/147 |
| 8,508,300 B2 * | 8/2013 | Lee | .......................... | H03F 1/301 330/289 |
| 8,710,898 B1 * | 4/2014 | Chiang | ..................... | G05F 3/30 327/362 |
| 2008/0136396 A1 * | 6/2008 | Heilmann | ................. | G05F 1/56 323/298 |
| 2009/0146719 A1 * | 6/2009 | Pernia | ...................... | H03B 5/04 327/291 |
| 2009/0302824 A1 * | 12/2009 | Kim | .......................... | G05F 3/24 323/313 |
| 2014/0218123 A1 * | 8/2014 | Wei | .......................... | H03B 5/04 331/176 |

* cited by examiner

*Primary Examiner* — Thomas J Hiltunen
(74) *Attorney, Agent, or Firm* — Keith Taboada; Robert M. Brush

(57) ABSTRACT

In an example, a temperature-corrected voltage reference circuit for use in an integrated circuit (IC) includes a voltage reference circuit, a programmable gain amplifier, and a digital control circuit. The programmable gain amplifier includes a first input coupled to the voltage reference circuit, a second input coupled to receive a control signal, and an output coupled to provide a temperature-corrected voltage reference. The digital control circuit includes an input coupled to receive a temperature signal indicative of temperature of the IC and an output coupled to the second input of the programmable gain amplifier, the digital control circuit generating the control signal in response to the temperature signal.

20 Claims, 5 Drawing Sheets

TEMPERATURE CORRECTION OF AN ON-CHIP VOLTAGE REFERENCE

TECHNICAL FIELD

Examples of the present disclosure generally relate to electronic circuits and, in particular, to temperature correction of an on-chip voltage reference circuit.

BACKGROUND

Some circuits, such as analog-to-digital converters (ADCs), require a high-precision voltage reference for operation. When circuits that require a high-precision voltage reference are part of an integrated circuit (IC), a voltage reference is typically provided from a source external to the IC. Use of an external voltage source, however, can increase cost and requires an extra package pin on the IC to receive the external voltage reference. This extra cost can be avoided by including a voltage reference source as part of the IC (e.g., an on-chip voltage reference). A bandgap circuit is one type of voltage reference circuit that can be used to provide an on-chip voltage reference. However, circuits that provide an on-chip voltage reference, such as a bandgap circuit, can exhibit less accuracy than an external voltage source due to temperature fluctuations of the IC, which can be more extreme than the environment external to the IC. As the temperature of the IC varies, the voltage reference provided by an on-chip voltage reference circuit can exceed maximum or minimum tolerances for the particular application.

SUMMARY

Temperature correction of an on-chip voltage reference circuit is described. In one example, a temperature-corrected voltage reference circuit for use in an integrated circuit (IC) comprises a voltage reference circuit, a programmable gain amplifier, and a digital control circuit. The programmable gain amplifier includes a first input coupled to the voltage reference circuit, a second input coupled to receive a control signal, and an output coupled to provide a temperature-corrected voltage reference. The digital control circuit includes an input coupled to receive a temperature signal indicative of temperature of the IC and an output coupled to the second input of the programmable gain amplifier, the digital control circuit generating the control signal in response to the temperature signal.

In another example, an integrated circuit includes at least one temperature sensor, a voltage reference circuit, a programmable gain amplifier coupled to the voltage reference circuit, and a digital control circuit. The digital control circuit is coupled to the programmable gain amplifier, to adjust gain of the programmable gain amplifier based on temperature as measured by the at least one temperature sensor.

In another example, a method of correcting temperature dependence of a voltage reference circuit in an integrated circuit (IC) includes: coupling a voltage reference from the voltage reference circuit to a programmable gain amplifier; receiving a temperature signal indicative of temperature of the IC; and adjusting gain of the programmable gain amplifier in response to the temperature signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Temperature correction of an on-chip voltage reference circuit is described. In one example, a voltage reference circuit, such as a bandgap circuit, is coupled to a programmable gain amplifier. The programmable gain amplifier includes a digital control input used to adjust gain as applied to the output of the voltage reference circuit. A digital control circuit is coupled to the digital control input to adjust the gain of the programmable gain amplifier based on measurements of IC temperature. For example, the digital control circuit can obtain IC temperature measurements from one or more temperature sensors in the IC or from another circuit in the IC that cooperates with one or more temperature sensors. As the IC temperature fluctuates, the gain of the programmable gain amplifier can be adjusted to correct for the temperature coefficient of the voltage reference circuit. In this manner, the accuracy of the voltage reference circuit is improved using digital techniques.

The accuracy of an on-chip voltage reference circuit can be improved using various analog design techniques combined with trimming at wafer sort. Such analog design techniques, however, exhibit increased cost in terms of power consumption and implementation area on the IC. The digital techniques of correcting for the temperature coefficient of the voltage reference circuit described require less power and less implementation area than typical analog design techniques, which reduces cost. These and further aspects of temperature correction of an on-chip voltage reference circuit are discussed further below with respect to the following figures.

Figure 1:
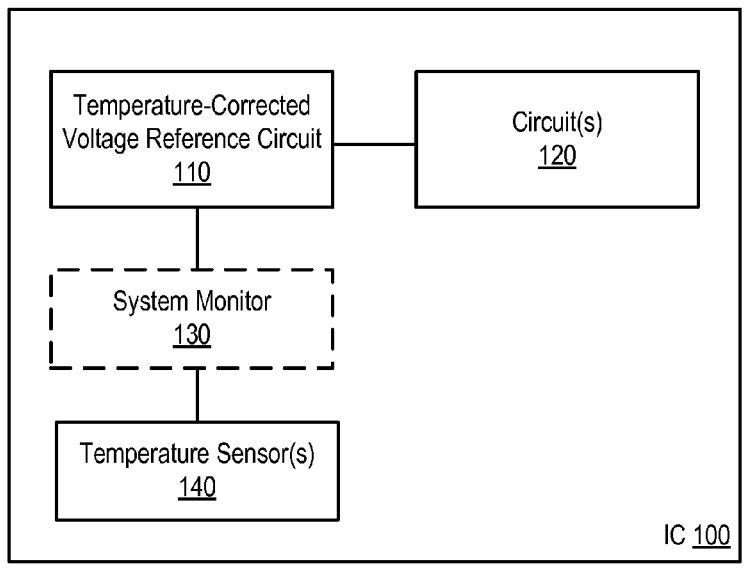
FIG. 1 is a block diagram depicting an example integrated circuit (IC).

FIG. 1 is a block diagram depicting an example integrated circuit (IC) 100. The IC 100 includes a temperature-corrected voltage reference circuit 110, circuits 120, and temperature sensor(s) 140. In some examples, the IC 100 includes an optional system monitor 130. The temperature-corrected voltage reference circuit 110 provides a temperature-corrected voltage reference for use by the circuits 120. The temperature-corrected voltage reference is a direct current (DC) signal having a target voltage. The circuits 120 can be any type of circuit that utilizes a reference voltage, such as an analog-to-digital converter (ADC).

The temperature sensor(s) 140 provide a temperature signal that indicates measurements of temperature within the IC 100. In an example, the temperature-corrected voltage reference circuit 110 is coupled to receive the temperature signal from the temperature sensor(s) 140. As described in detail below, the temperature-corrected voltage reference circuit 110 uses the temperature signal to generate the temperature-corrected voltage reference. In another example, the temperature-corrected voltage reference circuit 110 is coupled to receive a temperature signal from the system monitor 130, which in turn receives a temperature signal from the temperature sensor(s) 140. The system monitor 130 can be any type of circuit that communicates with various sensors to measure various physical operating parameters, such as power supply voltages, die temperatures, and the like.

Figure 2:
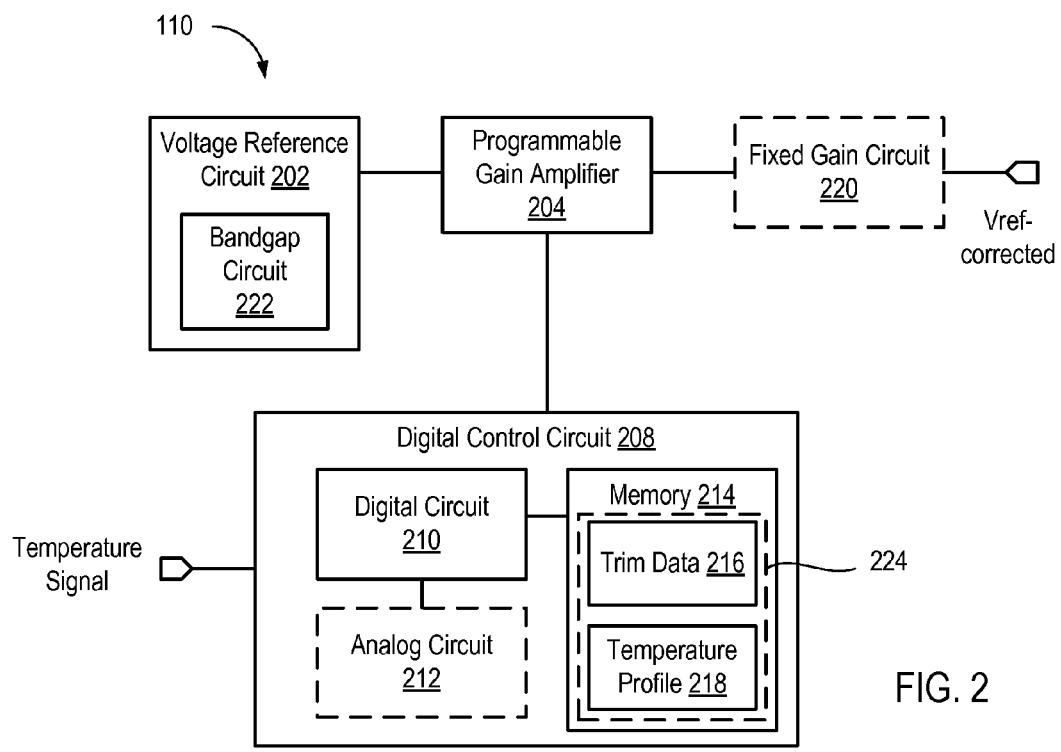
FIG. 2 is a block diagram showing an example of a temperature-corrected voltage reference circuit for use in the IC of FIG. 1.

FIG. 2 is a block diagram showing an example of the temperature-corrected voltage reference circuit 110. The temperature-corrected voltage reference circuit 110 includes a voltage reference circuit 202, a programmable gain amplifier 204, and a digital control circuit 208. The voltage reference circuit 202 generates a voltage reference. The voltage reference is a DC signal having a target voltage. In an example, the voltage reference circuit 202 includes a bandgap circuit 222 to generate the voltage reference. The voltage reference circuit 202 can include other types of voltage generation circuits known in the art, and the techniques of generating a temperature-corrected voltage reference described herein are not limited to use with the example bandgap circuit 222. In general, the voltage reference circuit 202 has a temperature dependence that can be compensated using the techniques described herein.

The programmable gain amplifier 204 receives a voltage reference from the voltage reference circuit 202. The programmable gain amplifier 204 also receives a control signal from the digital control circuit 208. The programmable gain amplifier 204 applies a gain to the voltage reference having a selectable value based on the control signal from the digital control circuit 208. Thus, the term "gain" as used herein encompasses both amplification and attenuation, including zero amplification/attenuation (e.g., unity gain or voltage following). The programmable gain amplifier 204 can have a plurality of discrete gain values selectable as discussed below.

The programmable gain amplifier 204 outputs a temperature-corrected voltage reference (Vref-corrected). In some examples, the temperature-corrected voltage reference circuit 110 includes a fixed gain circuit 220 coupled to the output of the programmable gain amplifier 204. The fixed gain circuit 220 applies a fixed gain to the temperature-corrected voltage reference, which can provide amplification or attenuation to cause the temperature-corrected voltage reference to have a target voltage. In other examples, the fixed gain circuit 220 is omitted and the programmable gain amplifier 204 provides the temperature-corrected voltage reference having the target voltage.

The digital control circuit 208 includes a digital circuit 210 and a memory 214. The memory 214 can include a non-volatile memory circuit or the like that is capable of retaining information without the presence of power applied to the IC 100. The digital circuit 210 generates the control signal for adjusting the variable gain of the programmable gain amplifier 204 in response to an input temperature signal and data stored in the memory 214. In an example, the memory 214 stores a lookup table 224. The lookup table 224 stores control codes corresponding to temperature measurements. In one example, the digital control circuit 208 selects a control code where, each control code may be associated with a discrete value for the gain applied by the programmable gain amplifier 204 to the voltage reference of the voltage reference circuit 202.

In an example, the lookup table 224 comprises trim data 216 and temperature profile data 218. The trim data 216 can include a control code associated with a particular gain corresponding to a particular reference temperature, such as 0° C. The trim data 216 can be set during wafer sort, for example. The temperature profile data 218 can include control codes for selecting gain values corresponding to temperatures above and below the reference temperature. The temperature profile data 218 can be set by measuring or estimating the temperature coefficient of the voltage reference circuit 202 over a desired temperature range. The digital circuit 210 can select a new code from the memory 214 to change the gain in response to each threshold change in temperature as indicated by the temperature signal (e.g., every 20° C. or other temperature intervals).

In an example, the temperature signal is a digital signal. For example, the digital control circuit 208 can receive a digital temperature signal from another circuit, such as a system monitor circuit or the like in the IC 100 that communicates with sensors, such as temperature sensors. In another example, the temperature signal can be an analog signal, such as an analog signal from one or more temperature sensors. In such case, the digital control circuit 208 can include an analog circuit 212 to convert the analog temperature signal to a digital temperature signal for processing by the digital circuits 210. For example, the analog circuit 212 can include an analog-to-digital converter (ADC).

Figure 3:
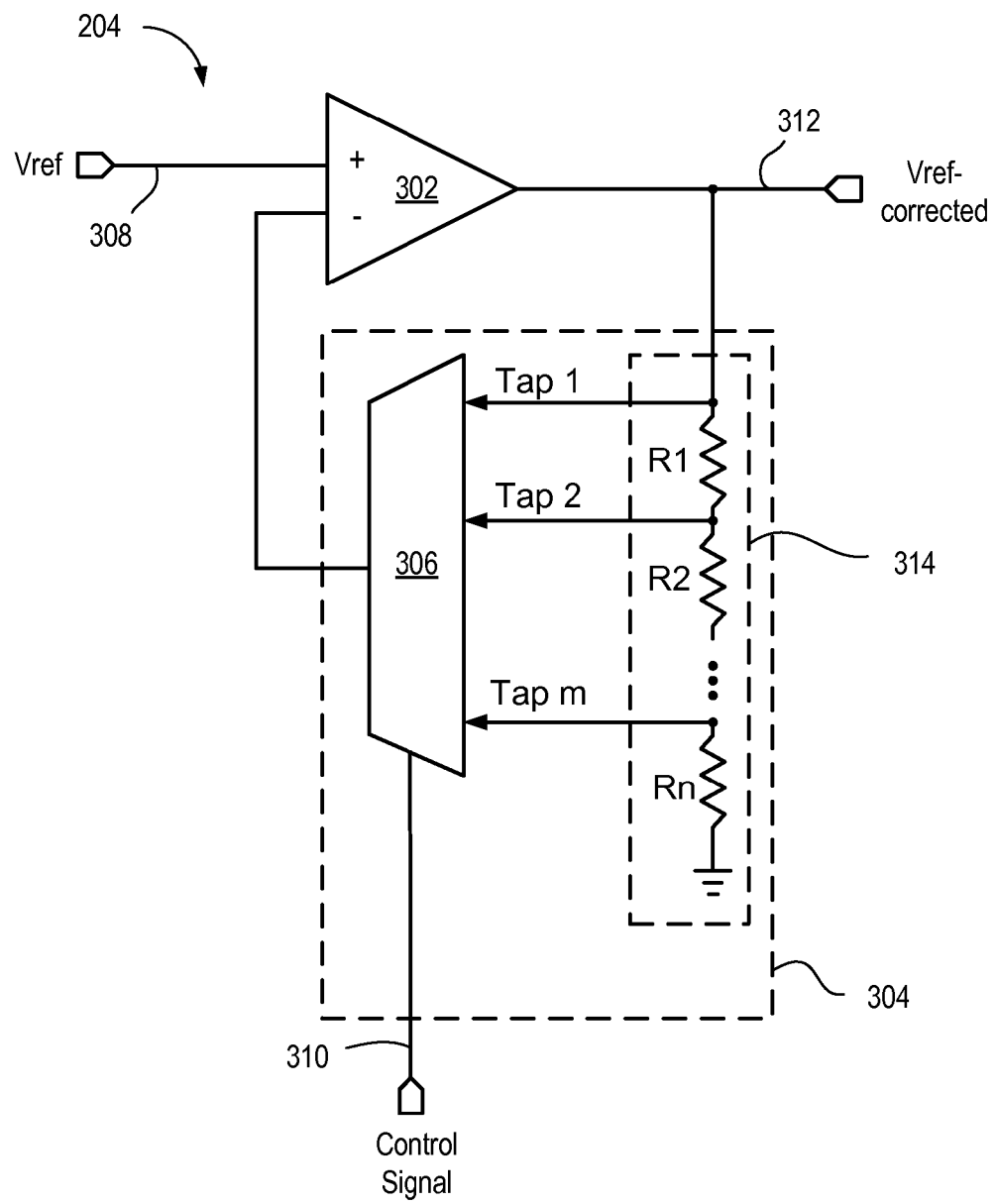
FIG. 3 is a schematic diagram depicting an example programmable gain amplifier for use in the temperature-corrected voltage reference circuit of FIG. 2.

FIG. 3 is a schematic diagram depicting an example of the programmable gain amplifier 204. The programmable gain amplifier 204 includes a differential amplifier 302 and a digital-to-analog converter (DAC) 304. In general, the programmable gain amplifier 204 includes a first input 308 coupled the voltage reference circuit 202 (shown in FIG. 2) to receive the voltage reference (Vref). The programmable gain amplifier 204 includes a second input 310 coupled to the digital control circuit 208 (shown in FIG. 2) to receive a control signal. The programmable gain amplifier 204 includes an output 312 coupled to provide a temperature-corrected voltage reference (Vref-corrected).

The differential amplifier 302 includes a non-inverting input terminal coupled to the first input of 308 to receive the voltage reference (Vref), an inverting input terminal coupled to an output of the DAC 304, and an output terminal coupled to the output 312 to provide the temperature-corrected voltage reference (Vref-corrected). The DAC 304 includes a first input terminal coupled to the second input 310 to receive the control signal, a second input terminal coupled to the output 312 to receive the temperature-corrected voltage reference (Vref-corrected), and an output terminal coupled to the inverting input terminal of the differential amplifier 302. The DAC 304 adjusts the gain of the differential amplifier 302 in response to the control signal.

In an example, the DAC 304 includes a resistor string 314 coupled in series between the output 312 and a reference voltage (e.g., electrical ground), and a multiplexer 306. The resistor string 314 includes a plurality of resistors R1 through Rn and a plurality of taps designated "Tap 1" through "Tap m", where n and m are integers greater than one. Each of the taps provides a different fraction of the temperature-corrected reference voltage (Vref-corrected) as determined by the value of the resistors R1 through Rn. Inputs of the multiplexer 306 are coupled to the taps "Tap 1" through "Tap m", respectively. An output of the multiplexer 306 is coupled to the inverting input of the differential amplifier. A control input of the multiplexer 306 is coupled to the second input 310 to receive the control signal. The multiplexer 306 drives a selected voltage from a tap of the resistor string 314 onto the output terminal of the DAC 304 in response to the control signal. The digital control circuit 208 can output different control codes as the control signal to select respective taps of the resistor string 314. In this manner, the digital control circuit 208 can control the gain of the differential amplifier 302 and hence the gain of the programmable gain amplifier 204.

Figure 4:
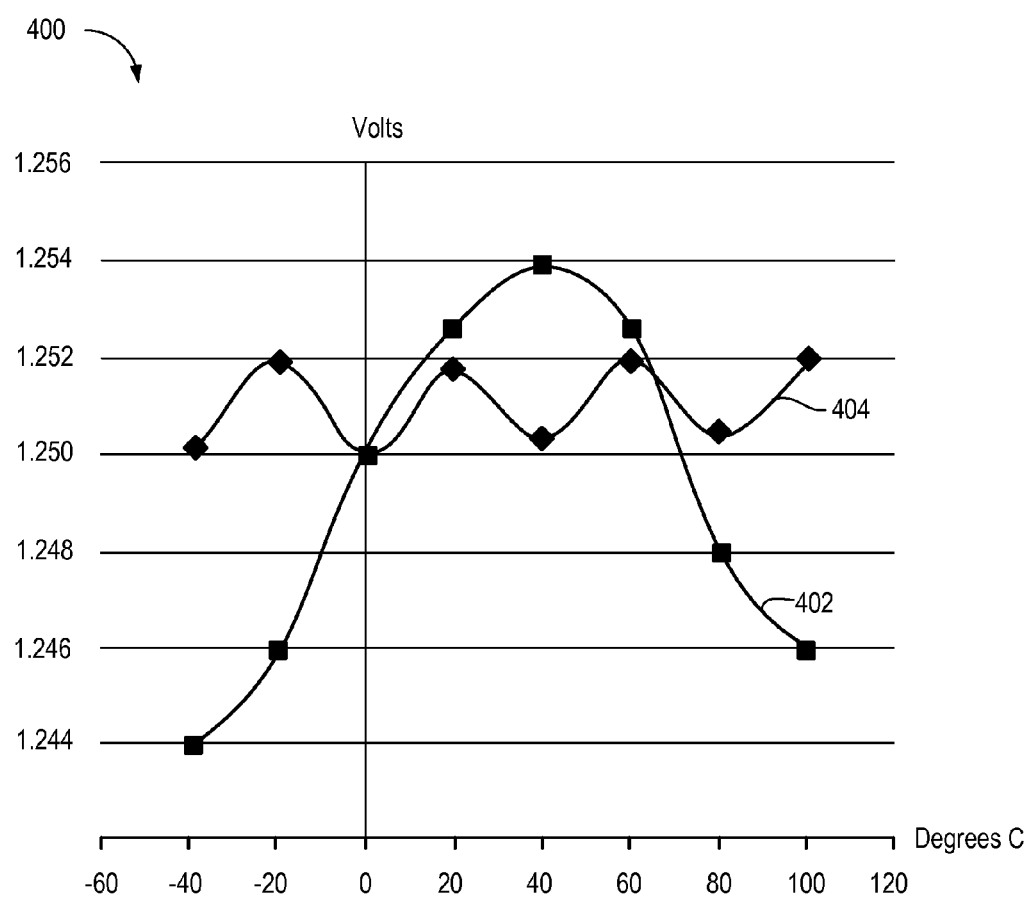
FIG. 4 is a graph depicting example plots of a voltage reference versus a temperature-corrected voltage reference.

FIG. 4 is a graph 400 depicting example plots of a voltage reference versus a temperature-corrected voltage reference. The graph 400 includes an x-axis representing temperature in degrees Celsius, and a y-axis representing voltage in Volts. A plot 402 shows output voltage versus temperature for the voltage reference circuit without temperature correction between −40° C. and 100° C. For example, the plot 402 represents the output of the temperature-corrected voltage reference circuit 110 if the gain of the programmable gain amplifier 204 is held constant and not adjusted for temperature. As shown in the plot 402, the voltage reference circuit without temperature correction outputs 1.25 V at 0° C. Assume in the present example that 1.25 V is the target voltage of the voltage reference. At −40° C., the plot 402 shows that the voltage reference dips to 1.244 V. Between −40° C. and 40° C., the voltage reference increases. At lower temperatures, a voltage reference, such as a bandgap circuit, can have a positive temperature coefficient (e.g., the plot 402 has a positive slope). At 40° C., the plot 402 shows that the voltage reference peaks at 1.254. At 100° C., the plot 402 shows that the voltage reference falls to 1.246. At higher temperatures, a voltage reference, such as a bandgap circuit, can have a negative temperature coefficient (e.g., the plot 402 has a negative slope). Thus, the voltage reference between −40° C. and 100° C. varies over a range 1.244 to 1.254 (e.g., 10 mV range). If the gain of the programmable gain amplifier is held constant over the temperature range, then the generated voltage reference will track the output of the voltage reference circuit 202, which exhibits temperature-dependence.

The plot 404 shows output voltage versus temperature for an example temperature-corrected voltage reference circuit (e.g., the temperature-corrected voltage reference circuit 110 with temperature correction applied as discussed above). At −40° C., the plot 404 shows the temperature-corrected voltage reference at approximately 1.25 V. At −20° C., the plot 404 shows the temperature-corrected voltage reference at approximately 1.252 V. At 0° C., the plot 404 shows the temperature-corrected voltage reference at the target 1.25 V. At 20° C., the plot 404 shows the temperature-corrected voltage reference at approximately 1.252 V. At 40° C., the plot 404 shows the temperature-corrected voltage reference at approximately 1.25 V. At 60° C., the plot 404 shows the temperature-corrected voltage reference at approximately 1.252 V. At 80° C., the plot 404 shows the temperature-corrected voltage reference at approximately 1.25 V. At 100° C., the plot 404 shows the temperature-corrected voltage reference at approximately 1.252 V. Thus, the temperature-corrected voltage reference between −40° C. and 100° C. varies over a range 1.25 to 1.252 (e.g., 2 mV), which is a five-fold increase in stability as compared to the un-corrected voltage reference.

In order to achieve the results of the plot 404, the gain of the programmable gain amplifier 204 is adjusted approximately every 20° C. change in temperature (e.g., at −20, 0, 20, 40, 60, and 80° C.). The graph 400 is merely one example. The voltage reference circuit can have a different temperature profile, the temperature-corrected voltage reference can vary between different voltage values, and the gain can be adjusted at different temperature intervals.

Figure 5:
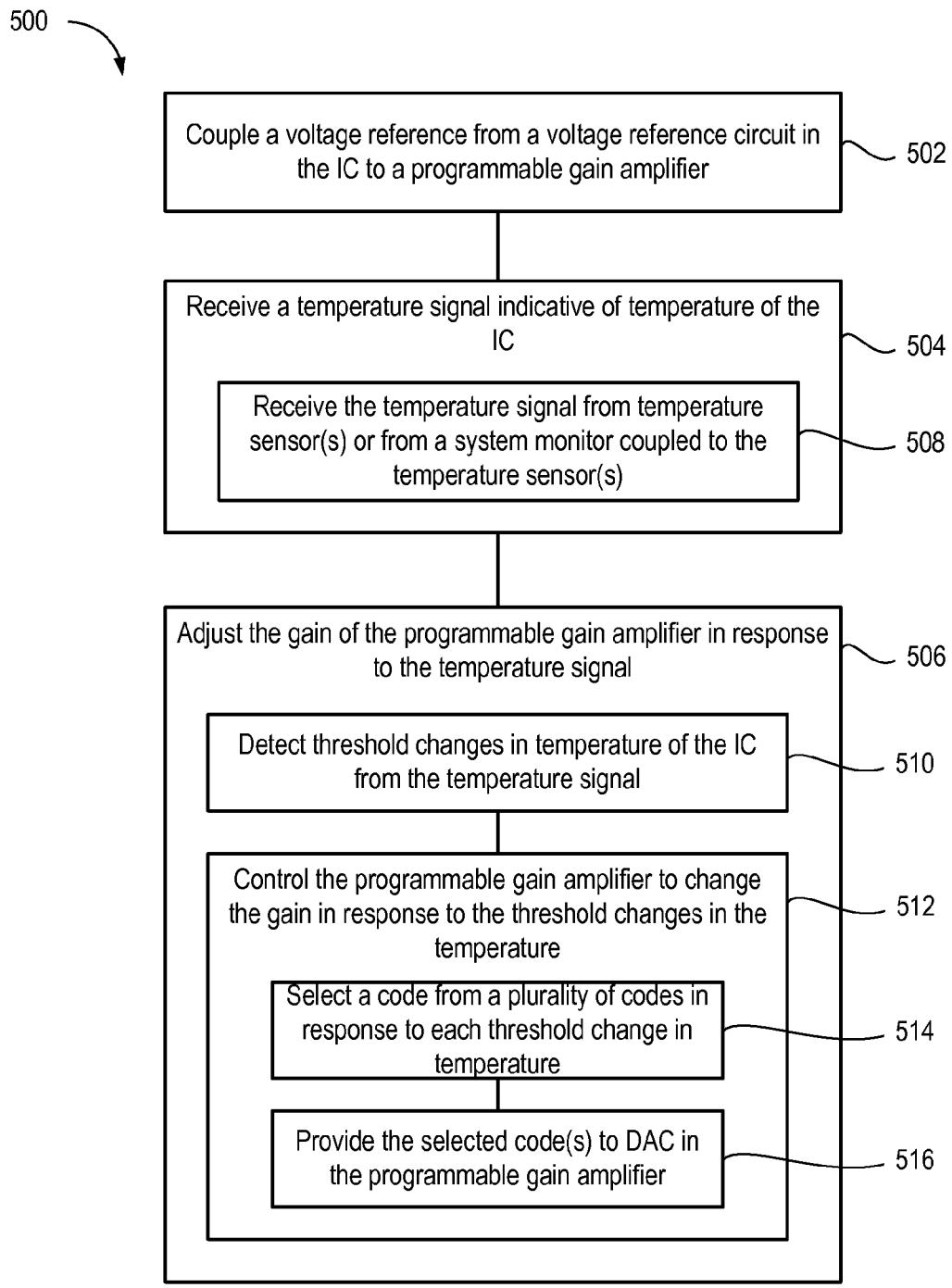
FIG. 5 is a flow diagram depicting an example method of correcting temperature dependence of a voltage reference circuit in an IC.

FIG. 5 is a flow diagram depicting an example method 500 of correcting temperature dependence of a voltage reference circuit in an IC. Aspects of the method 500 can be understood with reference to the temperature-corrected voltage reference circuit 110 shown in FIG. 2. The method 500 includes a step 502, where a voltage reference from the voltage reference circuit 202 in the IC is coupled to the programmable gain amplifier 204. At step 504, the digital control circuit 208 receives a temperature signal indicative of temperature of the IC. In an example, the digital control circuit 208 can receive the temperature signal from temperature sensor(s) in the IC, or from a system monitor coupled to such temperature sensor(s) (step 508).

At step 506, the digital control circuit 208 can adjust the gain of the programmable gain amplifier 204 in response to the temperature signal. The digital control circuit 208 can detect threshold changes in temperature of the IC from the temperature signal (step 510). The digital control circuit 208 can control the programmable gain amplifier 204 to change the gain in response to threshold changes in the temperature (step 512). For example, the digital control circuit 208 can select a code from a plurality of codes in response to each threshold change in temperature (step 514). The digital control circuit 208 can provide selected code(s) to the DAC 304 in the programmable gain amplifier 204.

Figure 6:
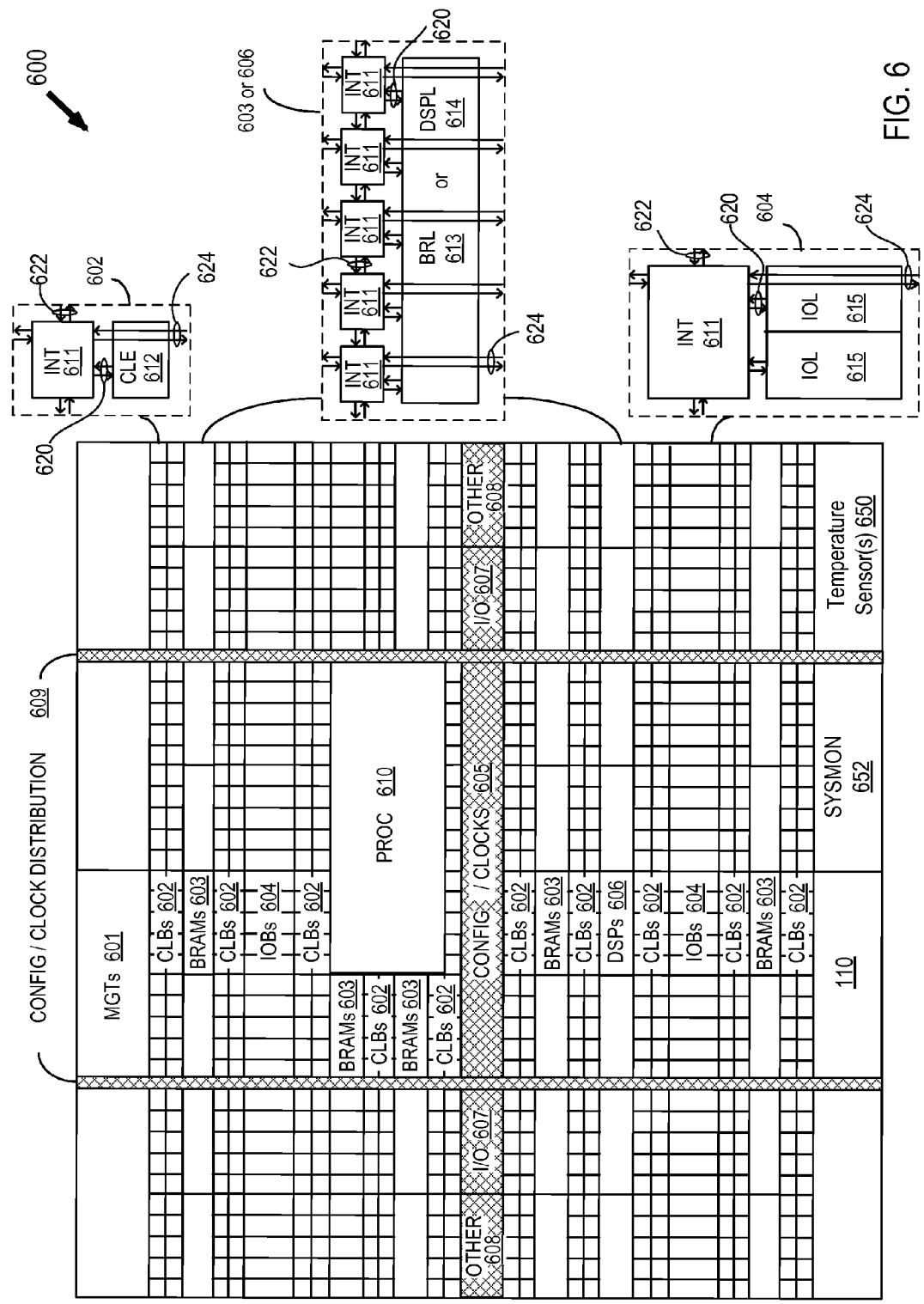
FIG. 6 illustrates an example field programmable gate array (FPGA) architecture having a temperature-corrected voltage reference circuit.

The temperature-corrected voltage reference circuit 110 can be used in a programmable IC, such as a field programmable gate array (FPGA). FIG. 6 illustrates an architecture of an FPGA 600 that includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile can include at least one programmable interconnect element ("INT") 611 having connections to input and output terminals 620 of a programmable logic element within the same tile, as shown by examples included at the top of FIG. 6. Each programmable interconnect element 611 can also include connections to interconnect segments 622 of adjacent programmable interconnect element(s) in the same tile or other tile(s). Each programmable interconnect element 611 can also include connections to interconnect segments 624 of general routing resources between logic blocks (not shown). The general routing resources can include routing channels between logic blocks (not shown) comprising tracks of interconnect segments (e.g., interconnect segments 624) and switch blocks (not shown) for connecting interconnect segments. The interconnect segments of the general routing resources (e.g., interconnect segments 624) can span one or more logic blocks. The programmable interconnect elements 611 taken together with the general routing resources implement a programmable interconnect structure ("programmable interconnect") for the illustrated FPGA.

In an example implementation, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 606 can include a DSP logic element ("DSPL") 614 in addition to an appropriate number of programmable interconnect elements. An 10B 604 can include, for example, two instances of an input/output logic element ("IOL") 615 in addition to one instance of the programmable interconnect element 611. As will be clear to those of skill in the art, the actual I/O pads connected, for example, to the I/O logic element 615 typically are not confined to the area of the input/output logic element 615.

In the pictured example, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs. The processor block 610 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 6 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

The FPGA 600 can include one or more temperature sensors 650 and the temperature-corrected voltage reference circuit 110. In some examples, the FPGA 600 can include a system monitor 652 for providing an interface between the temperature sensors 650 and the temperature-corrected voltage reference circuit 110. The temperature-corrected voltage reference circuit 110 can be used to provide a voltage reference for various circuits in the FPGA 600.

While the foregoing is directed to specific examples, other and further examples may be devised without departing from the basic scope thereof, and the scope thereof is determined by the claims that follow.

What is claimed is:

1. A temperature-corrected voltage reference circuit for use in an integrated circuit (IC), comprising:
   a voltage reference circuit;
   a programmable gain amplifier having a first input coupled to the voltage reference circuit, a second input coupled to receive a control signal, and an output coupled to provide a temperature-corrected voltage reference; and
   a digital control circuit having an input coupled to receive a temperature signal indicative of temperature of the IC and an output coupled to the second input of the programmable gain amplifier, the digital control circuit including a memory storing trim data that includes a control code associated with a first gain corresponding to a reference temperature and a temperature profile that includes a plurality of codes for selecting gain values corresponding to temperatures above and below the reference temperature, the digital control circuit generating the control signal in response to the temperature signal and based on the trim data and the temperature profile.

2. The temperature-corrected voltage reference circuit of claim 1, wherein the programmable gain amplifier comprises:
   an differential amplifier having a non-inverting input terminal coupled to the first input of the programmable gain amplifier, an inverting input terminal, and an output terminal coupled to the output of the programmable gain amplifier; and
   a digital-to-analog converter (DAC) having an input terminal coupled to receive the control signal, and an output terminal coupled to the inverting input terminal of the differential amplifier.

3. The temperature-corrected voltage reference circuit of claim 2, wherein the DAC comprises:
   a resistor string coupled in series between the output terminal of the differential amplifier and a reference voltage; and
   a multiplexer coupled to drive voltage from a tap of a plurality of taps of the resistor string onto the output terminal of the DAC in response to the control signal.

4. The temperature-corrected voltage reference circuit of claim 2, wherein the digital control circuit comprises:
   a digital circuit, coupled to the memory, to obtain a code from the memory in response to the temperature signal and output the code as the control signal.

5. The temperature-corrected voltage reference circuit of claim 4, wherein the digital control circuit is coupled to select the code from the plurality of control codes in response to a threshold change in temperature as indicated by the temperature signal.

6. The temperature-corrected voltage reference circuit of claim 5, wherein the gain values comprise a plurality of values for gain of the programmable gain amplifier.

7. The temperature-corrected voltage reference circuit of claim 1, wherein the voltage reference circuit comprises a bandgap circuit.

8. The temperature-corrected voltage reference circuit of claim 1, further comprising:
   a fixed gain circuit coupled to the output of the programmable gain amplifier.

9. The temperature-corrected voltage reference circuit of claim 1, wherein the digital control circuit is coupled to receive the temperature signal from a temperature sensor on the integrated circuit or a system monitor on the integrated circuit.

10. An integrated circuit, comprising:
    at least one temperature sensor;
    a voltage reference circuit;
    a programmable gain amplifier having a first input coupled to the voltage reference circuit, a second input coupled to receive a control signal, and an output coupled to provide a temperature-corrected voltage reference; and
    a digital control circuit having an input coupled to receive a temperature signal indicative of temperature of the IC from the at least one temperature sensor and an output coupled to the second input of the programmable gain amplifier, the digital control circuit including a memory storing trim data that includes a control code associated with a first gain corresponding to a reference temperature and a temperature profile that includes a plurality of codes for selecting gain values corresponding to temperatures above and below the reference temperature, the digital control circuit generating the control signal in response to the temperature signal and based on the trim data and the temperature profile.

11. The integrated circuit of claim 10, wherein the programmable gain amplifier comprises:
   an differential amplifier having a non-inverting input terminal coupled to the voltage reference circuit, an inverting input terminal, and an output terminal; and
   a digital-to-analog converter (DAC) having an input terminal coupled to the digital control circuit and an output terminal coupled to the inverting input terminal of the differential amplifier.

12. The integrated circuit of claim 11, wherein the DAC comprises:
   a resistor string coupled in series between the output terminal of the differential amplifier and a reference voltage; and
   a multiplexer coupled to drive voltage from a tap of a plurality of taps of the resistor string onto the output terminal of the DAC in response to the digital control circuit.

13. The integrated circuit of claim 11, wherein the digital control circuit comprises:
   a digital circuit, coupled to the memory, to obtain a code from the memory in response to the temperature as measured by the at least one temperature sensor and provide the code to the DAC to adjust the gain of the programmable gain amplifier.

14. The integrated circuit of claim 10, wherein the voltage reference circuit comprises a bandgap circuit.

15. The integrated circuit of claim 10, further comprising:
   a fixed gain circuit coupled to the output of the programmable gain amplifier.

16. The integrated circuit of claim 10, further comprising:
   a system monitor coupled to the at least one temperature sensor;
   wherein the digital control circuit is coupled to receive the temperature from the system monitor.

17. A method of correcting temperature dependence of a voltage reference circuit in an integrated circuit (IC), comprising:
   coupling a voltage reference from the voltage reference circuit to a programmable gain amplifier having a first input coupled to the voltage reference circuit, a second input coupled to receive a control signal, and an output coupled to provide a temperature-corrected voltage reference;
   receiving a temperature signal indicative of temperature of the IC, at a digital control circuit having an input coupled to receive a temperature signal indicative of temperature of the IC and an output coupled to the second input of the programmable gain amplifier, the digital control circuit including a memory storing trim data that includes a control code associated with a first gain corresponding to a reference temperature and a temperature profile that includes a plurality of codes for selecting gain values corresponding to temperatures above and below the reference temperature, the digital control circuit generating the control signal in response to the temperature signal and based on the trim data and the temperature profile; and
   adjusting gain of the programmable gain amplifier in response to the temperature signal, via the control signal.

18. The method of claim 17, wherein the step of receiving the temperature comprises:
   receiving a temperature signal from at least one temperature sensor in the IC or from a system monitor coupled to the at least one temperature sensor.

19. The method of claim 17, wherein the step of adjusting the gain of the programmable gain amplifier comprises:
   detecting threshold changes in the temperature of the IC from the temperature signal; and
   controlling the programmable gain amplifier to change the gain thereof in response to each of the threshold changes in the temperature.

20. The method of claim 19, wherein the step of controlling the programmable gain amplifier comprises:
   selecting a code from a plurality of codes in response to each of the threshold changes in the temperature of the IC, the plurality of codes being associated with a respective plurality of values of the gain of the programmable gain amplifier; and
   providing each code as selected to a digital-to-analog converter (DAC) of the programmable gain amplifier.

* * * * *